US012575339B2

(12) United States Patent
Ha

(10) Patent No.: US 12,575,339 B2
(45) Date of Patent: Mar. 10, 2026

(54) SEMICONDUCTOR DEVICE WITH A SELECTOR LAYER

(71) Applicant: SK hynix Inc., Icheon-si (KR)

(72) Inventor: Tae Jung Ha, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 185 days.

(21) Appl. No.: 18/460,437

(22) Filed: Sep. 1, 2023

(65) Prior Publication Data

US 2024/0341206 A1     Oct. 10, 2024

(30) Foreign Application Priority Data

Apr. 6, 2023     (KR) ......................... 10-2023-0045376

(51) Int. Cl.
*G11C 13/00*       (2006.01)
*H10B 63/00*       (2023.01)
*H10N 70/00*       (2023.01)

(52) U.S. Cl.
CPC ........... *H10N 70/826* (2023.02); *H10B 63/80* (2023.02); *H10N 70/021* (2023.02); *H10N 70/041* (2023.02); *H10N 70/063* (2023.02); *H10N 70/066* (2023.02); *H10N 70/883* (2023.02); *G11C 13/0038* (2013.01); *G11C 13/004* (2013.01); *G11C 13/0069* (2013.01)

(58) Field of Classification Search
CPC .. H10N 70/826; H10N 70/021; H10N 70/041; H10N 70/063; H10N 70/066; H10N 70/883; H10N 70/231; H10N 70/20; H10N 70/8833; H10N 70/841; H10N 79/00; H10B 63/80; H10B 63/20; H10B 63/24; H10B 63/00; H10B 63/84; G11C 13/0038; G11C 13/004; G11C 13/0069
See application file for complete search history.

(56) References Cited

U.S. PATENT DOCUMENTS

2019/0058006 A1*  2/2019  Karpov .............. G11C 13/0007
2020/0365657 A1*  11/2020  Lee ......................... H10B 63/80
2021/0280246 A1  9/2021  Jo
2022/0076713 A1*  3/2022  Jeong ..................... H10B 63/24

FOREIGN PATENT DOCUMENTS

KR          20190026411 A        3/2019

* cited by examiner

*Primary Examiner* — Jerome Leboeuf
(74) *Attorney, Agent, or Firm* — Perkins Coie LLP

(57)          ABSTRACT

Semiconductor devices and fabrication methods of semiconductor devices are disclosed. In an embodiment, a semiconductor device May include a plurality of memory cells, and each of the plurality of memory cells may include: a resistive layer including a material having a specific resistance and including a lower portion and an upper portion disposed over the lower portion, wherein a width of the lower portion is smaller than a width of an uppermost surface of the upper portion; a selector layer disposed over the resistive layer and structured to perform a threshold switching by exhibiting different electrically conductive states in response to an applied voltage relative to a threshold voltage; and a memory layer disposed over the selector layer and structured to store data.

7 Claims, 13 Drawing Sheets second
direction first
direction

SEMICONDUCTOR DEVICE WITH A SELECTOR LAYER

CROSS-REFERENCE TO RELATED APPLICATION

This patent document claims the priority and benefits of Korean Patent Application No. 10-2023-0045376 filed on Apr. 6, 2023, which is incorporated herein by reference in its entirety.

TECHNICAL FIELD

The technology disclosed in this patent document relates to a semiconductor technology, and more particularly, to a semiconductor device including a memory cell including a selector, and a method for fabricating the same.

BACKGROUND

The recent trend toward miniaturization, low power consumption, high performance, and multi-functionality in the electrical and electronics industry has compelled the semiconductor manufacturers to focus on, high-performance, high capacity semiconductor devices. Examples of such high-performance, high-capacity semiconductor devices include memory devices that can store data by switching between different resistance states according to an applied voltage or current, such as an RRAM (resistive random access memory), a PRAM (phase change random access memory), an FRAM (ferroelectric random access memory), an MRAM (magnetic random access memory), and an electronic fuse (E-fuse).

SUMMARY

In an embodiment, a semiconductor device may include a plurality of memory cells, and each of the plurality of memory cells may include: a resistive layer including a material having a specific resistance and including a lower portion and an upper portion disposed over the lower portion, wherein a width of the lower portion is smaller than a width of an uppermost surface of the upper portion; a selector layer disposed over the resistive layer and structured to perform a threshold switching by exhibiting different electrically conductive states in response to an applied voltage relative to a threshold voltage; and a memory layer disposed over the selector layer and structured to store data.

In another embodiment, a method for fabricating a semiconductor device, may include: forming a pillar-shaped sacrificial pattern and first to $N^{th}$ insulating patterns over a substrate, the first to $N^{th}$ insulating patterns sequentially disposed from the sacrificial pattern while surrounding a side surface of the sacrificial pattern, wherein N is a natural number equal to or greater than 2; performing an etching operation on the sacrificial pattern and the first to $N_{th}$ insulating patterns; forming a hole by removing an etched sacrificial pattern on which the etching operation is performed; forming a resistive layer filling the hole and having a portion extending upward from the hole; and forming a selector layer and a memory layer over the resistive layer, wherein etch rates of the first to $N_{th}$ insulating patterns are smaller than an etch rate of the sacrificial pattern, and the etch rates of the first to $N_{th}$ insulating patterns decrease as distances from the sacrificial pattern increase.

DETAILED DESCRIPTION

Figure 1:
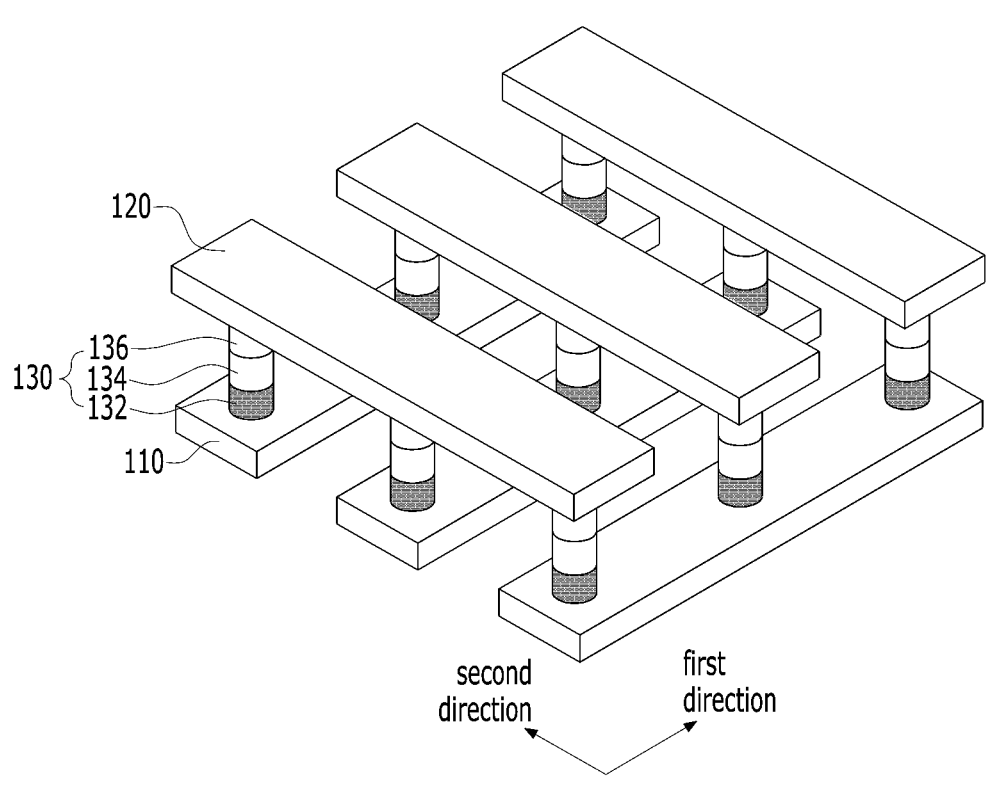
FIG. 1 is a perspective view illustrating a semiconductor device based on some embodiments of the disclosed technology.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a perspective view illustrating a semiconductor device based on some embodiments of the disclosed technology.

Referring to FIG. 1, the semiconductor device implemented based on some embodiments of the disclosed technology may include a plurality of first conductive lines 110 extending in a first direction and parallel to each other, a plurality of second conductive lines 120 extending in a second direction crossing the first direction and parallel to each other, and a plurality of memory cells 130 interposed between the first conductive lines 110 and the second conductive lines 120 while overlapping intersection regions of the first conductive lines 110 and the second conductive lines 120, respectively.

The first conductive line 110 and the second conductive line 120 may be connected to both ends of the memory cell 130, respectively. In some embodiments, the first conductive line 110 is disposed under the second conductive line 120, but the present disclosure is not limited thereto, and the upper and lower positions of the first conductive line 110 and the second conductive line 120 may be reversed. One of the first conductive line 110 and the second conductive line 120 may function as a word line and the other may function as a bit line. Each of the first conductive line 110 and the second conductive line 120 may include various conductive materials, for example, a metal such as platinum (Pt), tungsten (W), aluminum (Al), copper (Cu), tantalum (Ta), or titanium (Ti), a metal nitride such as titanium nitride (TiN) or tantalum nitride (TaN), or a combination thereof.

The memory cell 130 may have a pillar shape between the first conductive line 110 and the second conductive line 120 so as to overlap an intersection region thereof. The memory cell 130 may include a stacked structure of a resistive layer 132, a selector layer 134, and a memory layer 136.

The memory layer 136 may store data in various ways. As an example, the memory layer 136 may include a variable resistance layer that stores different data bits by switching between different resistance states of the variable resistance layer according to a voltage or current supplied through upper and lower ends thereof. The variable resistance layer may have a single-layer structure or multi-layer structure including various materials or various material layers that can be used in RRAM, PRAM, FRAM, MRAM, or others. For example, a metal oxide such as a transition metal oxide or a perovskite-based material, a phase change material such as a chalcogenide-based material, a ferroelectric material, a ferromagnetic material, or others can be used for the variable resistance layer.

The resistance of the selector layer 134 has a non-linear dependence with the applied voltage. In some implementations, the selector layer 134 is structured to control access to the memory layer 136 by being selectively in an electrically conductive state or "on state" by exhibiting a low electrical resistance to allow a current to pass through or an electrically non-conductive state or "off state" by exhibiting a high electrical resistance to block or reduce the passage of the current under a control a voltage or current applied to the selector layer 134. In some implementations, the electrically non-conductive state or "off state" of the selector layer 134 may be used to prevent or reduce undesired current leakage that may occur between memory cells 130 sharing the first conductive line 110 or the second conductive line 120. In some implementations, the selector layer 134 may have a threshold switching characteristic that allows no current to flow through the selector layer 134 when a voltage applied to both ends of the memory cell MC 130 is less than a predetermined threshold voltage and allows current to flow through the selector layer 134 and to rapidly increase when the applied voltage exceeds the threshold voltage. Therefore, the selector layer 134 may be turned on to be electrically conductive at the applied voltage across the memory cell MC above the threshold voltage and may be turned off to be electrically non-conductive at a voltage across the memory cell MC below the threshold voltage.

The selector layer 134 may include a diode, an OTS (Ovonic Threshold Switching) material such as a chalcogenide-based material, an MIEC (Mixed Ionic Electronic Conducting) material such as a metal-containing chalcogenide-based material, an MIT (Metal Insulator Transition) material such as $NbO_2$ or $VO_2$, or a tunneling insulating material having a relatively wide band gap, such as $SiO_2$ or $Al_2O_3$.

In some implementations, the selector layer 134 may include an insulating material doped with dopants. In one example, the insulating material may include a silicon-containing insulating material such as silicon oxide, silicon nitride, or silicon oxynitride, an insulating metal oxide, an insulating metal nitride, or a combination thereof. The dopants may serve to create trap sites that trap or capture conductive carriers migrating within the insulating material or provide a path for the captured conductive carriers to migrate again. To form such a trap site, various elements capable of generating an energy level accommodating the conductive carriers in the insulating material may be used as the dopants. As an example, when the insulating material contains silicon, the dopants may include a metal having a different valence from silicon, such as gallium (Ga), boron (B), indium (In), phosphorus (P), arsenic (As), antimony (Sb), germanium (Ge), carbon (C), tungsten (W), or a combination thereof. Alternatively, when the insulating material contains a metal, the dopant may include another metal having a different valence from the metal, silicon, or others. As an example, the selector layer 134 may include silicon dioxide ($SiO_2$) doped with arsenic (As). When a voltage higher than the threshold voltage is applied to the selector layer 134 including the insulating material doped with the dopants, the conductive carriers may move through the trap sites, so that an on-state (On state) in which current flows through the selector layer 134 may be implemented. When a voltage applied to the selector layer 134 is reduced to less than the threshold voltage, the conductive carriers may not move, and thus, an off-state (OFF state) in which current does not flow may be implemented.

The resistive layer 132 may include a material having a specific resistance, that is, a resistivity. The resistive layer 132 may be used to reduce the hold current of the selector layer 134. When the selector layer 134 is connected to the resistive layer 132, the magnitude of a current flowing through the selector layer 134 may decrease due to, for example, a voltage divider effect caused by the voltage drop at the resistive layer 132 due to the resistance of the resistive layer 132 for a voltage applied between the first conductive line 110 and the second conductive line 120. Accordingly, the hold current, which is a minimum current required to maintain the on state of the selector layer 134, may be reduced.

The resistive layer 132 may have a relatively large resistance value. For example, the resistance of the resistive layer 132 may be greater than the resistance of the first conductive line 110 and/or the second conductive line 120. As an example, the resistive layer 132 may include a conductive material such as a metal or a metal alloy, a silicon-containing insulating material such as silicon oxide, silicon nitride, or silicon oxynitride, an insulating metal oxide, or an insulating metal nitride. When the resistive layer 132 includes a conductive material, it may include a conductive material having higher resistance than the first conductive line 110 and/or the second conductive line 120. As an example, when the first conductive line 110 and/or the second conductive line 120 include tungsten (W), the resistive layer 132 may include titanium nitride (TiN) or tungsten silicon nitride (WSiN). Alternatively, when the resistive layer 132 includes an insulating material, the resistive layer 132 may include an insulating material having a thin thickness to allow a current to flow through the insulating material at an operating voltage of the memory cell 130, e.g., a thin layer of a suitable insulating material of several to several tens of Å in some implementations. However, the present disclosure is not limited thereto, and various materials having higher resistance than the resistance of the first conductive line 110 and/or the second conductive line 120 may be used as the resistive layer 132.

Meanwhile, the necessity of reducing the hold current of the selector layer 134 will be described below. The hold current of the selector layer 134 may mean a minimum current required to maintain the selector layer 134 in the on-state. When an operating current of the memory cell 130, for example, a write current flowing during a write operation for storing data in the memory cell 130 or a read current flowing during a read operation for reading data stored in the memory cell 130 is greater than the hold current, the selector layer 134 may maintain the on-state at the corresponding operating current. Accordingly, normal operation may be possible. On the other hand, when the operating current of the memory cell 130, for example, the write current or the read current is smaller than the hold current, an oscillation phenomenon may occur in which the selector layer 134 repeats between the on-state and the off-state at the corresponding operating current. In this case, a normal operation may be impossible. The disclosed technology can be implemented in some embodiments to lower the hold current. When the hold current is lowered, the operating current may become greater than the hold current, so that an operating failure may be reduced and/or prevented.

In some embodiments, by way of example only, the memory cell 130 includes the stacked structure of the resistive layer 132, the selector layer 134, and the memory layer 136. In other embodiments, the layer structure of the memory cell 130 may be variously modified. As an example, an electrode layer (not shown) may be interposed between the first conductive line 110 and the resistive layer 132, between the resistive layer 132 and the selector layer 134, between the selector layer 134 and the memory layer 136, or between the memory layer 136 and the second conductive line 120. The electrode layer may function to electrically connect the layers positioned below and above the electrode layer while physically separating them from each other, and may include various conductive materials for this purpose. For example, the electrode layer may include a metal such as platinum (Pt), tungsten (W), aluminum (Al), copper (Cu), tantalum (Ta), or titanium (Ti), a metal nitride such as titanium nitride (TiN) or tantalum nitride (TaN), or a combination thereof. Alternatively, the electrode layer may include carbon.

Figure 2:
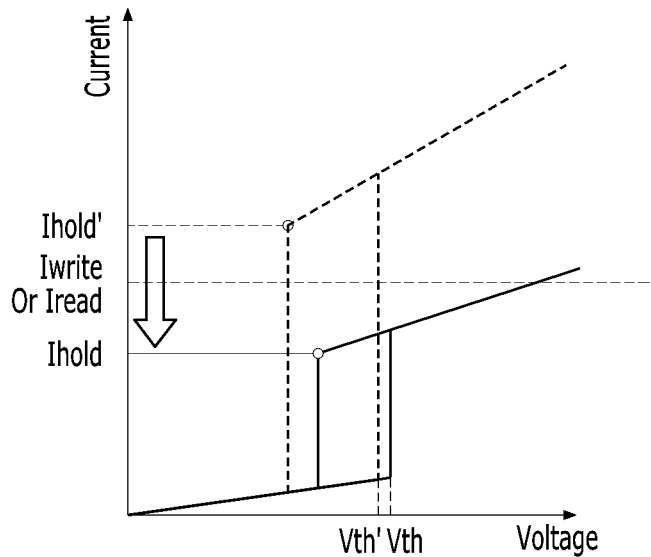
FIG. 2 is a current-voltage graph illustrating an operation of a selector layer of a memory cell of FIG. 1 and an operation of a selector layer of a memory cell of a comparative example.

FIG. 2 is a current-voltage graph illustrating an operation of a selector layer of a memory cell of FIG. 1 and an operation of a selector layer of a memory cell of a comparative example. The memory cell of the comparative example may have a memory cell that does not include the resistive layer, different from the memory cell of FIG. 1. In FIG. 2, solid lines indicate the operation of the selector layer of the memory cell of FIG. 1, and dotted lines indicate the operation of the selector layer of the memory cell of the comparative example.

Referring to FIG. 2, when a voltage applied to the selector layer of the comparative example gradually increases to reach a threshold voltage Vth', the selector layer may be turned on and a current flow may rapidly increase. Once the selector layer is turned on, the selector layer may maintain the on-state even under a voltage lower than the threshold voltage Vth' by a predetermined amount. However, when the voltage applied to the selector layer decrease below a limit for maintaining the on-state, the selector layer may become turned off again. In FIG. 2, a current flowing when the selector layer is turned off, that is, a minimum current required to maintain the on state of the selector layer is denoted by a hold current Ihold'.

In addition, when a voltage applied to the selector layer based on some embodiments gradually increases and reaches the threshold voltage Vth, the selector layer may be turned on and a rapid current flow may occur. After the selector layer is once turned on, the selector layer may maintain the on-state even when a voltage lower than the threshold voltage Vth by a predetermined amount is applied. However, when the voltage applied to the selector layer is lowered below a limit or a minimum current for maintaining the on-state, the selector layer may be turned off again. In FIG. 2 a current flowing when the selector layer is turned off, that is, a minimum current required to maintain the on-state of the selector layer is denoted by a hold current Ihold.

At this time, a current flowing through the selector layer in the on-state of the selector layer (hereinafter referred to as an on current) in some embodiments may be lower than an on current of the selector layer of the comparative example. This may be because, as described above, when the selector layer is connected to the resistive layer as in some embodiments, the current flowing through the selector layer is reduced. Therefore, the hold current Ihold of the selector layer implemented based on some embodiments may be lower than the hold current Ihold' of the selector layer of the comparative example (see arrow in FIG. 2).

Under the hold current Ihold lowered as described above, it may be facilitated for a write current Iwrite or a read current Iread to become larger than the hold current Ihold. Accordingly, the selector layer implemented based on some embodiments can reduce or minimize an oscillation phenomenon and the resulting operation failure.

In some embodiments, as the thickness of the resistive layer 132 increases, the current flowing through the selector layer 134 may be reduced, and accordingly, the hold current of the selector layer 134 may be reduced. However, it may be difficult to increase the thickness of the resistive layer 132 as desired due to the characteristics of the material of the resistive layer 132 or the limitation of the aspect ratio, and accordingly, it may be difficult to decrease the hold current of the selector layer 134 as desired. That is, controlling the hold current of the selector layer 134 may be difficult. The disclosed technology can be implemented in some embodiments to provide a semiconductor device capable of sufficiently reducing the hold current of the selector layer 134 without increasing the thickness of the resistive layer 132, and a method for fabricating the semiconductor device.

Figure 3:
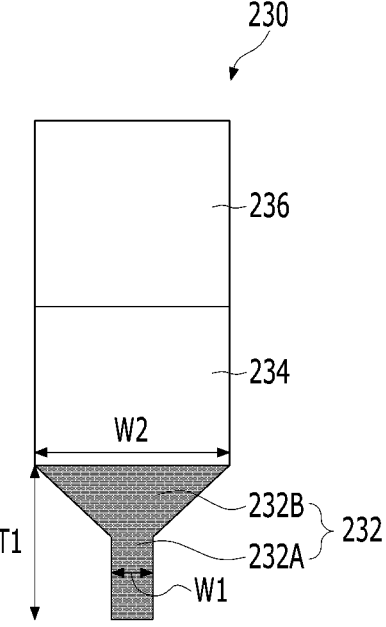
FIG. 3 is a cross-sectional view illustrating a memory cell included in a semiconductor device based on some embodiments of the disclosed technology.

FIG. 3 is a cross-sectional view illustrating a memory cell included in a semiconductor device based on some embodiments of the disclosed technology. Detailed descriptions of parts substantially the same as those of the above embodiment will be omitted.

Referring to FIG. 3, a memory cell 230 according to some embodiments may include a stacked structure of a resistive layer 232, a selector layer 234, and a memory layer 236.

In some implementations, the resistive layer 232 may include a lower portion 232A and an upper portion 232B disposed over the lower portion 232A. In some implementations, the lower portion 232A may have a substantially constant width W1 and/or a planar area. In one example, has a fixed value. In another example, the width W1 slightly varies depending on the height. In some implementations, the term "substantially constant width" can be used to indicate a width W1 that varies within a range of 5% or less. That is, the maximum value of the width W1 may be less than or equal to 1.05 times of the minimum value of the width W1. The upper portion 232B may have a width and/or planar area that increases from bottom to top. The lower surface of the upper portion 232B, which is in contact with the upper surface of the lower portion 232A, may have a minimum width, and the upper surface of the upper portion 232B may have a maximum width. The width of the lower surface of the upper portion 232B may be substantially the same as the width W1 of the lower portion 232A. The width W2 of the upper surface of the upper portion 232B, that is, the width W2 of the uppermost surface of the resistive layer 232 may be greater than the width W1.

In some embodiments, even if the thickness T1 of the resistive layer 232 cannot be increased as much as desired due to a limitation, by reducing the width W1 of the lower portion 232A of the resistive layer 232, an effect corresponding to the increase in the thickness T1 of the resistive layer 232 may be obtained because as the width W1 of the lower portion 232A of the resistive layer 232 decreases, the current flowing through the selector layer 234 is reduced, and accordingly, the hold current of the selector layer 234 is reduced. In other words, if the width W1 is controlled together with the thickness T1, the hold current of the selector layer 234 may be lowered as desired, and thus, the hold current control of the selector layer 234 may be facilitated. Furthermore, the width W2 of the uppermost surface of the resistive layer 232 that is greater than the width W1 can make it easier for the resistive layer 232 to be in contact with a layer positioned thereon, for example, the selector layer 234.

As will be described later, the resistive layer 232 may be patterned separately from the selector layer 234 and the memory layer 236. Accordingly, the sidewall of the resistive layer 232 may not be aligned with the sidewall of the selector layer 234 and the sidewall of the memory layer 236.

In some embodiments, the selector layer 234 and the memory layer 236 may be patterned together, and thus may have sidewalls aligned with each other. In other embodiments, the selector layer 234 and the memory layer 236 may be separately patterned, and thus may have sidewalls that are not aligned with each other.

In some embodiments, the lower surface of the selector layer 234 may have substantially the same width as the width W2. In other embodiments, the width of the lower surface of the selector layer 234 may have a different width from the width W2.

Figure 4A:
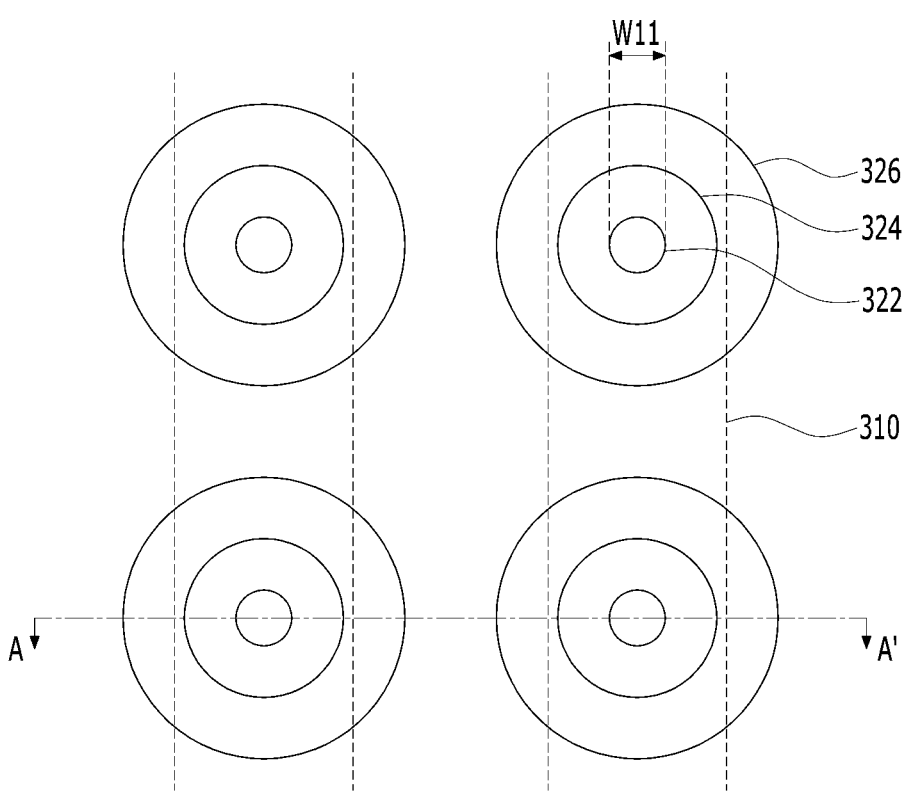
FIGS. 4A to 9B illustrate a semiconductor device and a method for fabricating the semiconductor device based on some embodiments of the disclosed technology.
Figure 4B:
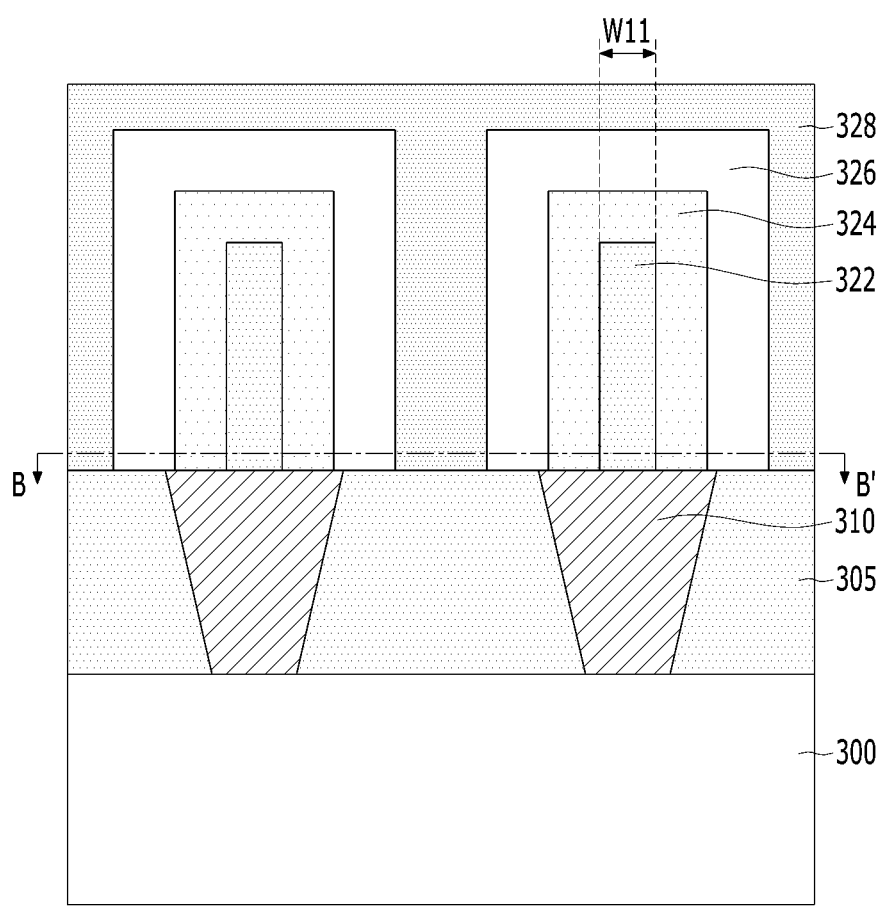
Figure 5:
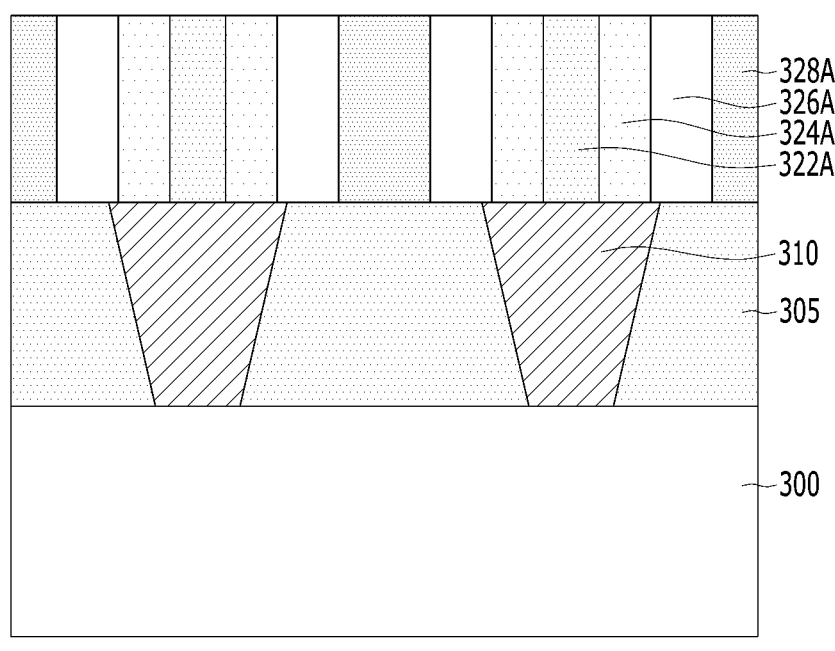
Figure 6:
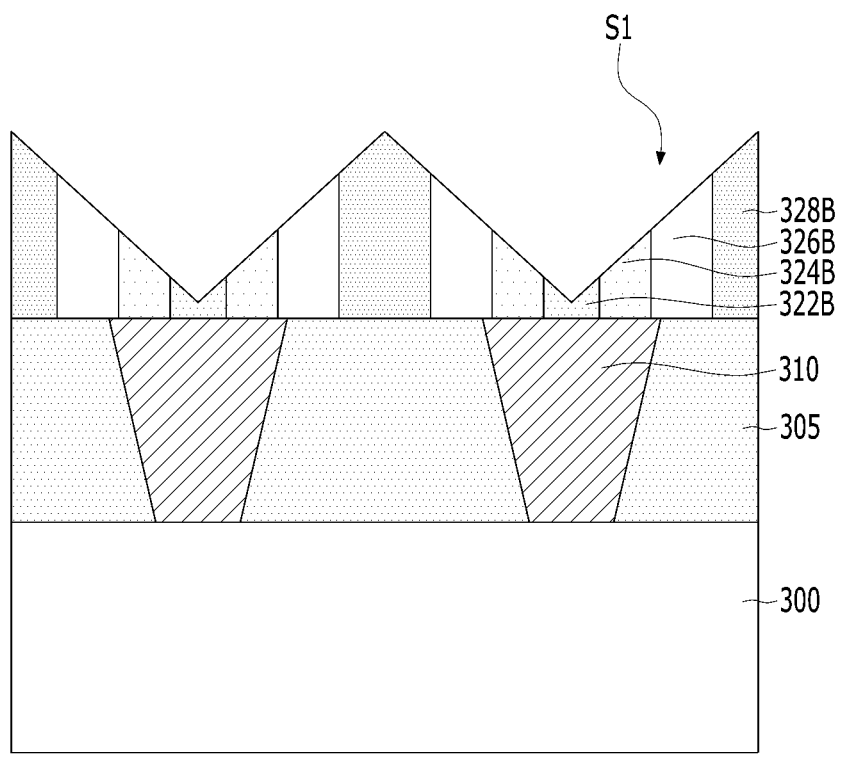
Figure 7:
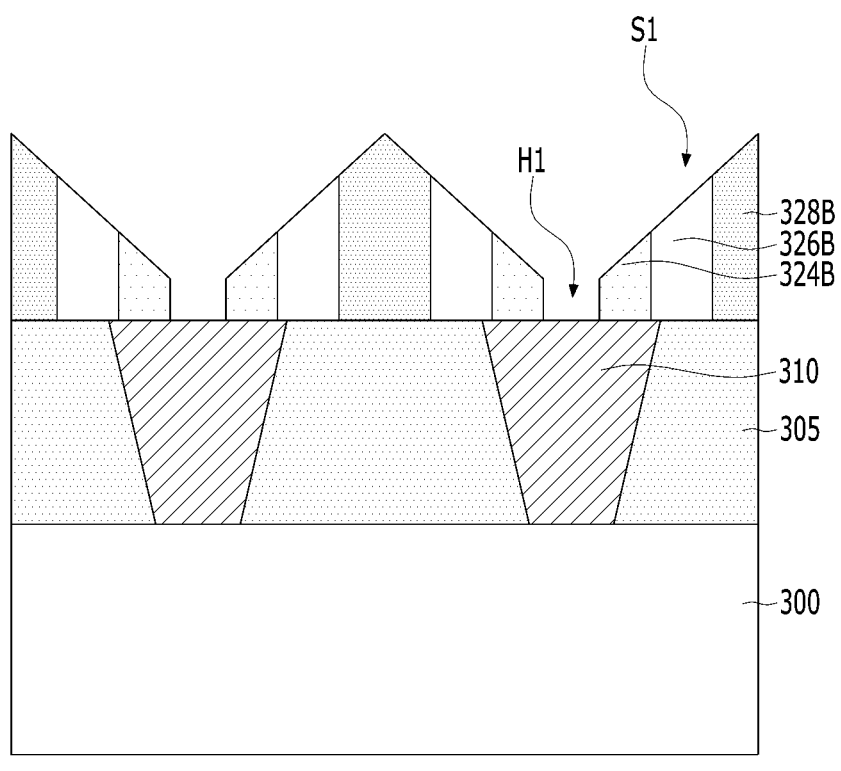
Figure 8A:
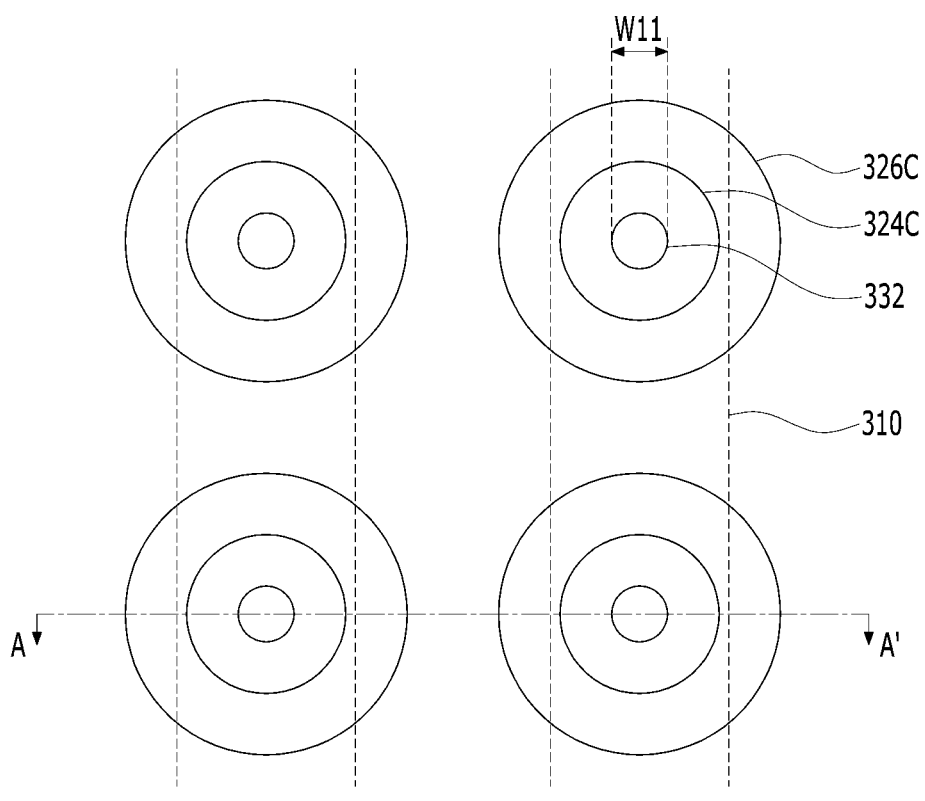
Figure 8B:
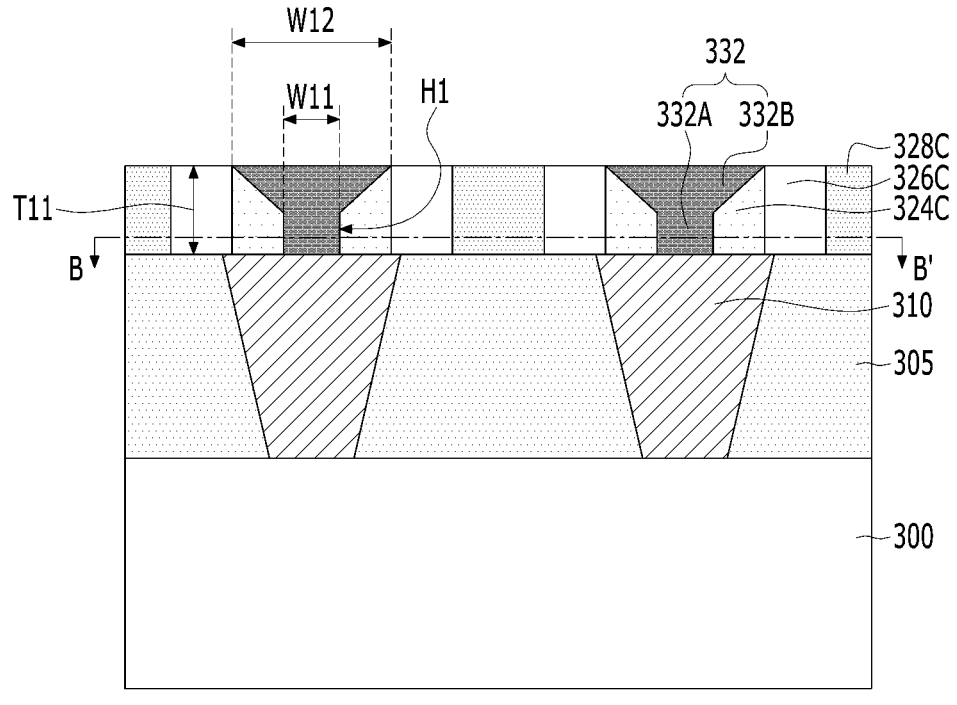
Figure 9A:
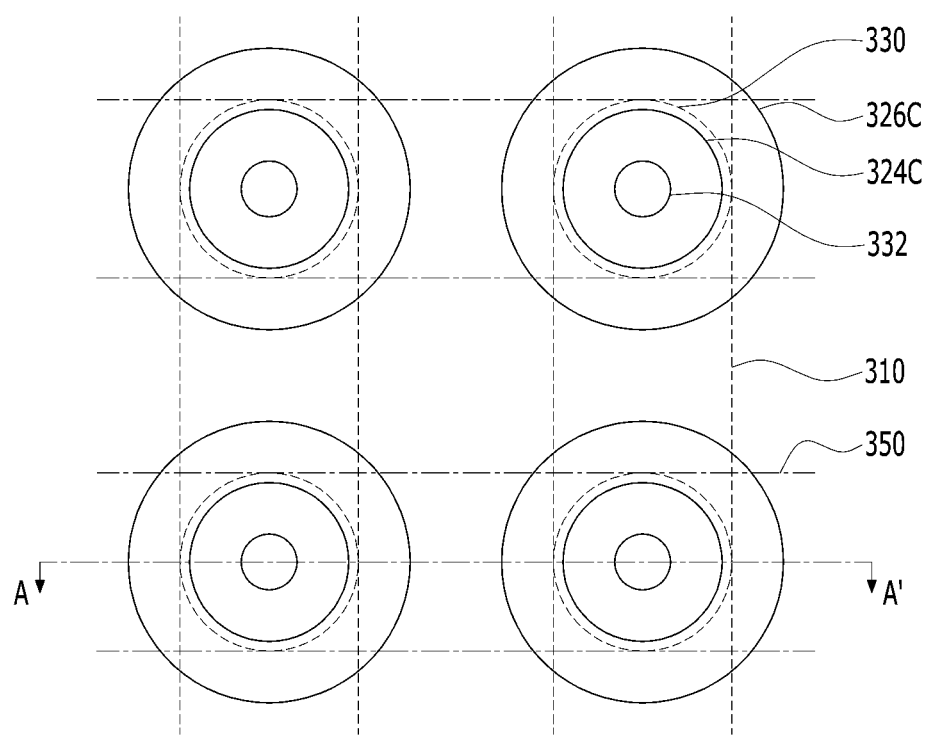
Figure 9B:
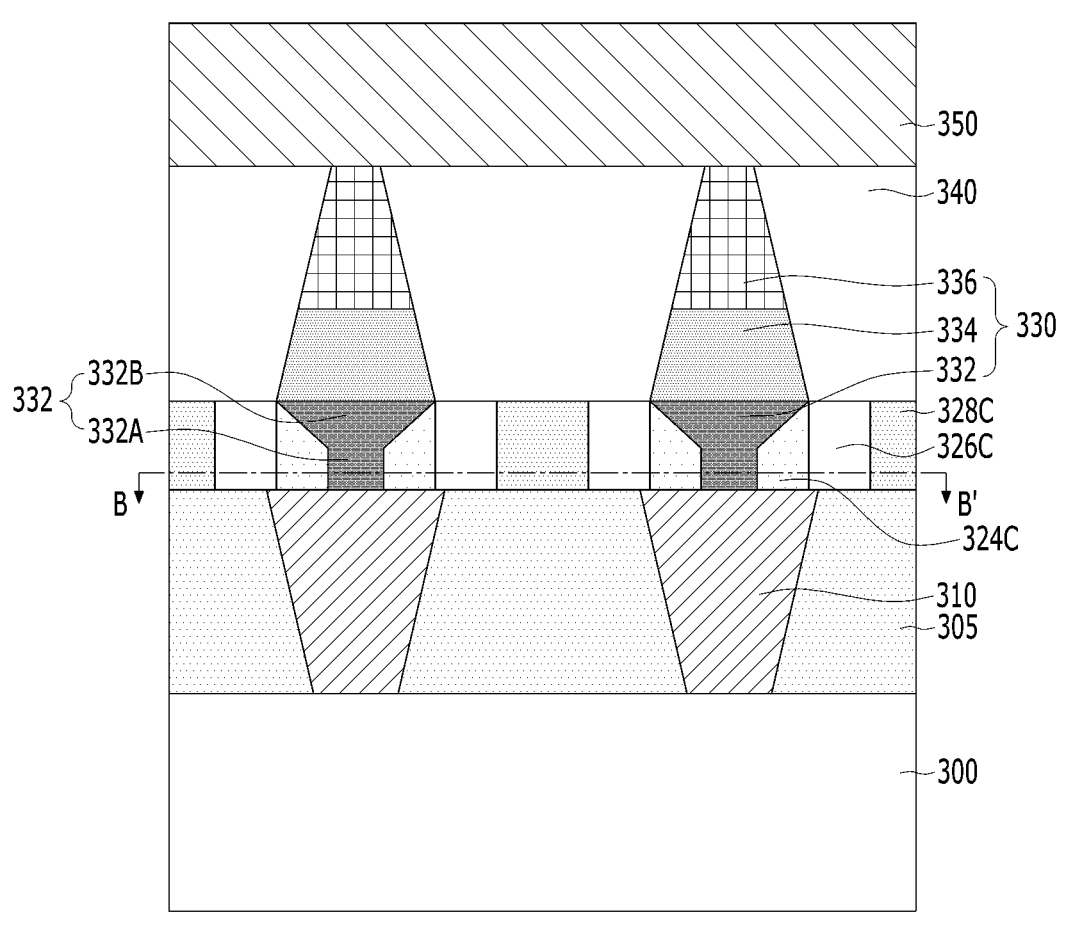

FIGS. 4A to 9B are views illustrating a semiconductor device and a method for fabricating the same based on some embodiments of the disclosed technology. FIGS. 4A, 8A, and 9A show plan views, and FIGS. 4B, 8B, and 9B show cross-sectional views taken along the lines A-A' of FIGS. 4A, 8A, and 9A, respectively. FIGS. 5 to 7 show cross-sectional views illustrating process steps between the process of FIGS. 4A and 4B and the process of FIGS. 8A and 8B. The plan views of FIGS. 4A, 8A, and 9A are shown at the height of the lines B-B' of FIGS. 4B, 8B, and 9B, respectively, and components not visible at the height of the line B-B' are shown together with dotted lines for convenience of description.

The semiconductor device discussed above may be fabricated as will be discussed below.

Referring to FIGS. 4A and 4B, a substrate 300 may be provided. The substrate 300 may include a semiconductor material such as silicon, and a predetermined lower structure (not shown) may be formed in the substrate 300. For example, the substrate 300 may include a driving circuit for driving a first conductive line (see 310 in FIGS. 4A and 4B) and/or a second conductive line (see 350 in FIGS. 9A and 9B) to be described later.

Subsequently, a first conductive line 310 and a first interlayer insulating layer 305 may be formed over the substrate 300. A plurality of first conductive lines 310 may be arranged apart from each other in a second direction parallel to the line A-A' while extending in a first direction crossing the line A-A'. In some embodiments, only two first conductive lines 310 are shown, but the number of first conductive lines 310 may be variously modified. The first interlayer insulating layer 305 may be formed to fill a space between the first conductive lines 310 over the substrate 300. The first conductive line 310 and the first interlayer insulating layer 305 may be formed by depositing an insulating material, for example, silicon oxide, silicon nitride, or a combination thereof, for forming the first interlayer insulating layer 305 over the substrate 300, selectively etching the insulating material to form the first interlayer insulating layer 305 providing a space in which the first conductive line 310 is to be buried, depositing a conductive material having a thickness sufficiently filling the space, and performing a planarization process, for example, CMP (Chemical Mechanical Polishing) until the upper surface of the first interlayer insulating layer 305 is exposed. In other implementations, the first conductive line 310 and the first interlayer insulating layer 305 may be formed by depositing a conductive material for forming the first conductive line 310 over the substrate 300, selectively etching the conductive material to form the first conductive line 310, depositing an insulating material covering the first conductive line 310, and performing a planarization process until the upper surface of the first conductive line 310 is exposed.

Subsequently, a sacrificial pattern 322 and first to third insulating patterns 324, 326, and 328 may be formed over the first conductive line 310 and the first interlayer insulating layer 305. The sacrificial pattern 322 and the first to third insulating patterns 324, 326, and 328 may have different etch rates.

The sacrificial pattern 322 may have a pillar shape. In some embodiments, the sacrificial pattern 322 has a circular shape in a plan view. In other embodiment, and the sacrificial pattern 322 may have a non-circular shape, such as a square shape. The sacrificial pattern 322 may be a portion to be replaced with a lower portion of a resistive layer (refer to 332A in FIG. 8B), which will be described later, and may be formed to have the same width as the lower portion of the resistive layer. The width of the sacrificial pattern 322 is indicated by a reference numeral W11. The width W11 of the sacrificial pattern 322 may be substantially constant. A plurality of sacrificial patterns 322 may be arranged spaced apart from each other in the first direction while overlapping each of the plurality of first conductive lines 310 in the second direction. As a result, the plurality of sacrificial patterns 322 may be arranged in a matrix form along the first and second directions. The sacrificial pattern 322 may be formed by depositing a sacrificial material and selectively etching the sacrificial material.

The first insulating pattern 324 may be conformally formed over the sacrificial pattern 322 along the surface of the sacrificial pattern 322, that is, along the upper and side surfaces of the sacrificial pattern 322. Accordingly, the first insulating pattern 324 may have a pillar shape surrounding the surface of the sacrificial pattern 322. The second insulating pattern 326 may be conformally formed over the first insulating pattern 324 along the surface of the insulating pattern 324. Accordingly, the second insulating pattern 326 may have a pillar shape surrounding the surface of the first insulating pattern 324. The third insulating pattern 328 may be conformally formed along the surface of the second insulating pattern 326, and may be formed to a thickness sufficient to fill a space between the pillar-shaped second insulating patterns 326. Each of the first to third insulating patterns 324, 326, and 328 may be formed by a deposition method such as ALD (atomic layer deposition). Here, three insulating patterns 324, 326, and 328 are described by way of example only, and the number of insulating patterns may be two or may be more than three. That is, first to Nth insulating patterns (where N is a natural number equal to or greater than 2) may be sequentially formed from the sacrificial pattern 322. The first to N–1$_{th}$ insulating patterns among the first to Nth insulating patterns may have pillar shapes surrounding the surfaces of the sacrificial pattern 322 and the first to N–2$_{th}$ insulating patterns, respectively. The Nth insulating pattern may be formed to a thickness sufficiently filling a space between the N–1$_{th}$ insulating patterns while surrounding the surface of the N–1$_{th}$ insulating pattern.

Relationships between the sacrificial pattern 322 and the first to third insulating patterns 324, 326, and 328 will be described below in detail. The sacrificial pattern 322 may include a material having the highest etch rate during an etching process (refer to FIG. 6), which will be described later. The first to third insulating patterns 324, 326, and 328 may include materials having etch rates lower than the etch rate of the sacrificial pattern 322 during the etching process. Furthermore, the first to third insulating patterns 324, 326, and 328 may have etch rates that decrease as the distances from the sacrificial pattern 322 increase. In other words, the etch rate of the first insulating pattern 324 may be less than the etch rate of the sacrificial pattern 322, the etch rate of the second insulating pattern 326 may be less than the etch rate of the first insulating pattern 324, and the etch rate of the third insulating pattern 328 may be less than the etch rate of the second insulating pattern 326. Assuming that the first to Nth insulating patterns exist, the etch rate of the t$_{th}$ insulating pattern (where t is a natural number of equal to or greater than 2 and equal to or smaller than N), among the first to Nth insulating patterns, may be less than the etch rate of the t–1$_{th}$ insulating pattern. In addition, the sacrificial pattern 322 may include a material that can be easily removed during a process of removing the sacrificial pattern 322 described later (see FIG. 7). The first to third insulating patterns 324, 326, and 328 may include a material that is substantially maintained during the process of removing the sacrificial pattern 322, that is, a material that is not lost or is lost to an insignificant degree. In other words, during the process of removing the sacrificial pattern 322, only the sacrificial pattern 322 may be selectively removed, and the first to third insulating patterns 324, 326, and 328 may be maintained.

Any material may be used to form the sacrificial pattern 322, and the first to third insulating patterns 324, 326, and 328 as long as the above relationship is satisfied. For example, the sacrificial pattern 322 may include a conductive material such as carbon, a metal, an alloy, a conductive metal compound, or others, or an insulating material such as silicon oxide, silicon nitride, silicon oxynitride, or a combination thereof. Also, each of the first to third insulating patterns 324, 326, and 328 may include an insulating material such as silicon oxide, silicon nitride, silicon oxynitride, or a combination thereof. Here, the insulating material may further include impurities such as carbon, boron, or others. The etch rate may vary depending on the type of material, but may also vary depending on the composition ratio between constituent elements even in the same material. For example, the sacrificial pattern 322, the first insulating pattern 324, the second insulating pattern 326, and the third insulating pattern 328 may be formed of different materials of which constituent elements are different. Alternatively, for example, at least two of the sacrificial pattern 322, the first insulating pattern 324, the second insulating pattern 326, and the third insulating pattern 328 may be formed of the same material including the same constituent elements, but the composition ratio of the elements of one of the at least two of the sacrificial pattern 322, the first insulating pattern 324, the second insulating pattern 326, and the third insulating pattern 328 may be different from the composition ratio of the elements of another one of the at least two of the sacrificial pattern 322, the first insulating pattern 324, the second insulating pattern 326, and the third insulating pattern 328. Alternatively, the etch rate may be different depending on the type or content of the impurities.

As an example, the sacrificial pattern 322 may include silicon nitride, and the first to third insulating patterns 324, 326, and 328 may include silicon oxide. Here, the silicon content of each of the first to third insulating patterns 324, 326, and 328 may be varied. For example, the first insulating pattern 324 may have the highest silicon content, the third insulating pattern 328 may have the lowest silicon content, and the second insulating pattern 326 may have an intermediate silicon content, because, in general, the higher the silicon content in silicon oxide, the higher the etch rate. During the etching process of the sacrificial pattern 322, and the first to third insulating patterns 324, 326, and 328 using an etching gas containing fluorine, for example, a mixed gas of nitrogen trifluoride ($NF_3$) and oxygen ($O_2$), a mixed gas of hydrogen fluoride (HF) and oxygen ($O_2$), or chlorine trifluoride ($ClF_3$) gas, the sacrificial pattern 322 may etched most quickly, and the first to third insulating patterns 324, 326, and 328 may be etched more slowly. Furthermore, the second insulating pattern 326 may be etched more slowly than the first insulating pattern 324, and the third insulating pattern 328 may be etched more slowly than the second insulating pattern 326. This may be because silicon nitride is etched faster than silicon oxide in these fluorine-containing gases. In addition, during the process of removing the sacrificial pattern 322, when the sacrificial pattern 322, and the first to third insulating patterns 324, 326, and 328 are exposed to a chemical containing phosphoric acid, only the sacrificial pattern 322 may be selectively removed, because a chemical containing phosphoric acid may selectively remove silicon nitride.

Referring to FIG. 5, a planarization process, for example, CMP, may be performed until the upper surface of the sacrificial pattern 322 is exposed. In some implementations, the planarization process may be performed to expose all of the sacrificial pattern 322, and the first to third insulating patterns 324, 326, and 328 to an etching gas during the etching process (refer to FIG. 6), which will be described later.

The sacrificial pattern, the first insulating pattern, the second insulating pattern, and the third insulating pattern after this planarization process are denoted by reference numerals 322A, 324A, 326A, and 328A, respectively. After the planarization process, the first insulating pattern 324A may have a pillar shape surrounding the side surface of the sacrificial pattern 322A while exposing the upper surface thereof, the second insulating pattern 326A may have a pillar shape surrounding the side surface of the first insulating pattern 324A while exposing the upper surface thereof, and the third insulating pattern 328A may fill a space between the second insulating patterns 326A to cover the side surface of the second insulating pattern 326A while exposing the upper surface thereof.

Referring to FIG. 6, the etching process may be performed on the resultant structure of FIG. 5. The etching process may be performed by a blanket etching without using a mask pattern. The sacrificial pattern, the first insulating pattern, the second insulating pattern, and the third insulating pattern after this etching process are denoted by reference numerals 322B, 324B, 326B, and 328B, respectively.

As described above, during the etching process, the etch rate of the first insulating pattern 324 may be less than the etch rate of the sacrificial pattern 322, the etch rate of the second insulating pattern 326 may be less than the etch rate of the first insulating pattern 324, the etch rate of the third insulating pattern 328 may be less than the etch rate of the second insulating pattern 326. That is, the etch rate of the sacrificial pattern 322 is maximum, and the etch rates of the first to third insulating patterns 324, 326, and 328 may decrease as the distances from the sacrificial pattern 322 increase. Therefore, after this etching process, the sacrificial pattern 322B may have the lowest height, the first insulating pattern 324B may have a greater height than the sacrificial pattern 322B, the second insulating pattern 326B may have a greater height than the first insulating pattern 324B, and the third insulating pattern 328B may have a greater height than the second insulating pattern 326B. As a result, as illustrated, a structure in which the upper surfaces of the sacrificial pattern 322B, and the first to third insulating patterns 324B, 326B, and 328B form an inclined surface may be obtained. A space defined by the upper surfaces of the sacrificial pattern 322B, and the first to third insulating patterns 324B, 326B, and 328B is denoted by a reference numeral S1. The space S1 may have a shape in which the width decreases from top to bottom, for example, a conical shape upside down or a shape similar thereto.

As an example, when the sacrificial pattern 322 includes silicon nitride and the first to third insulating patterns 324, 326, and 328 include silicon oxide having different silicon contents, the etching may be performed using an etching gas including fluorine.

Referring to FIG. 7, a hole H1 may be formed by removing the sacrificial pattern 322B exposed by the space S1.

As described above, the removal of the sacrificial pattern 322B may be performed using a gas or chemical capable of selectively removing only the sacrificial pattern 322B while substantially maintaining the first to third insulating patterns 324B, 326B, and 328B. As an example, when the sacrificial pattern 322 includes silicon nitride and the first to third insulating patterns 324, 326, and 328 include silicon oxide having different silicon contents, the sacrificial pattern 322B may be removed using a chemical containing phosphoric acid.

Referring to FIGS. 8A and 8B, a resistive layer 332 filling the hole H1 and having a portion extending over the hole H1 may be formed. The resistive layer 332 may be formed by forming a resistive material covering the upper surfaces of the sacrificial pattern 322B, and the first to third insulating patterns 324B, 326B, and 328B by sufficiently filling the hole H1 and the space S1 over the resultant structure of FIG. 7, and performing a planarization process, for example, CMP.

During the filling process of the hole H1 and the space S1, excellent filling characteristics may be secured because the space S1 has a shape in which the width decreases from top to bottom, Also, this planarization process may be performed until the thickness T11 of the resistive layer 332 becomes a desired value. Here, the thickness T11 of the resistive layer 332 may be greater than the height and/or depth of the hole H1. During this planarization process, the resistive layer 332 may be separated from another resistive layer 332 adjacent thereto. A portion of the resistive layer 332 buried in the hole H1 will be referred to as a lower portion 332A, and a portion positioned over the hole H1 and/or the lower portion 332A will be referred to as an upper portion 332B. The lower portion 332A may have the same width as the width W11 of the sacrificial pattern 322 described above. The upper portion 332B may have a width that increases from bottom to top. The lower surface of the upper portion 332B, which is in contact with the upper surface of the lower portion 332A, may have the minimum width, and the upper surface of the upper portion 332B may have the maximum width. The lower surface of the upper portion 332B may have a width substantially equal to the width W11, and the upper surface of the upper portion 332B, that is, the uppermost surface of the resistive layer 332 may have a width W12 greater than the width W11. In some embodiments, the case where the width W12 of the uppermost surface of the resistive layer 332 corresponds to the sum of the width W11 and twice the width of the first insulating pattern 324C is shown, but the present disclosure is limited thereto. On the premise that the resistive layer 332 is separated from another resistive layer 332 adjacent thereto, the width W12 of the uppermost surface of the resistive layer 332 may be adjusted in various ways.

The first insulating pattern, the second insulating pattern, and the third insulating pattern after the planarization process are denoted by reference numerals 324C, 326C, and 328C, respectively.

Referring to FIGS. 9A and 9B, a selector layer 334 and a memory layer 336 may be formed over the resistive layer 332. As a result, a memory cell 330 including the resistive layer 332, the selector layer 334, and the memory layer 336 may be formed. The selector layer 334 and the memory layer 336 may be formed by depositing a selector material for forming the selector layer 334 and a memory material for forming the memory layer 336 over the resistive layer 332, and the first to third insulating patterns 324C, 326C, and 328C, and selectively etching the selector material and the memory material. Etching of the selector material and memory material may be performed using a single mask. Accordingly, the selector layer 334 and the memory layer 336 may have a pillar shape, and may have sidewalls aligned with each other. In some embodiments, the case where the width of the lower surface of the selector layer 334 is equal to the width of the uppermost surface of the resistive layer 332 is illustrated, but the present disclosure is not limited thereto. On the premise that the selector layer 334 overlaps and contacts the resistive layer 332, the width of the lower surface of the selector layer 334 may be variously modified.

Subsequently, a second interlayer insulating layer 340 may be formed to fill a space between the stack structure of the selector layer 334 and the memory layer 336 and another stack structure adjacent thereto. The second interlayer insulating layer 340 may include various insulating materials such as silicon oxide, silicon nitride, or a combination thereof.

Subsequently, a second conductive line 350 may be formed over the memory layer 336 and the second interlayer insulating layer 340. A plurality of second conductive lines 350 may extend in the second direction to overlap the memory cells 330 arranged in the second direction, and may be spaced apart from each other in the first direction. In some embodiments, only two second conductive lines 350 are shown, but the number of second conductive lines 350 may be variously modified. As a result, the memory cells 330 may be disposed between the first conductive lines 310 and the second conductive lines 350 in intersection regions thereof.

The semiconductor device shown in FIGS. 9A and 9B may be obtained by using the method described above.

Referring back to FIGS. 9A and 9B, the semiconductor device according to some embodiments may include the substrate 300, the plurality of first conductive lines 310 disposed over the substrate 300 and extending parallel to each other in the first direction, the plurality of second conductive lines 350 disposed over the first conductive lines 310 and extending parallel to each other in the second direction, and the plurality of memory cells 330 disposed between the first conductive lines 310 and the second conductive lines 350 and respectively overlapping the intersection regions of the first conductive lines 310 and the second conductive lines 350.

Each of the plurality of memory cells 330 may include the resistive layer 332, the selector layer 334 disposed over the resistive layer 332, and the memory layer 336 disposed over the selector layer 334. Each of the resistive layer 332, the selector layer 334, and the memory layer 336 may have a pillar shape, and the resistive layer 332, the selector layer 334, and the memory layer 336 may overlap each other. The sidewalls of the selector layer 334 and the memory layer 336 may be aligned with each other, but the sidewall of the resistive layer 332 may not be aligned with the sidewalls of the selector layer 334 and the memory layer 336.

The resistive layer 332 may include the lower portion 332A and the upper portion 332B disposed over the lower portion 332A. The lower portion 332A may have a substantially constant width, and the upper portion 332B may have a width that increases from bottom to top while extending from the lower portion 332A. As a result, the width of the uppermost surface of the resistive layer 332 may be greater than the width of the lower portion 332A.

The first insulating pattern 324C may be formed to surround the side surface of the resistive layer 332, the second insulating pattern 326C may be formed to surround the side surface of the first insulating pattern 324C, and the third insulating pattern 328C may be formed to surround the side surface of the second insulating pattern 326C, while filling a space between the second insulating patterns 326C.

The second interlayer insulating layer 340 may be formed to fill a space between the stacked structures of the selector layers 334 and the memory layers 336.

Since the components of the semiconductor device have been described in more detail in the process of describing the fabricating method, detailed descriptions thereof will be omitted here.

The semiconductor device and the method for fabricating the same based on some embodiments of the disclosed technology, as described in FIG. 3, may control the hold current of the selector layer by forming a resistive layer having a small bottom width and a large top width. Furthermore, by using a sacrificial pattern and a plurality of insulating patterns having different etch rates when forming the resistive layer, a resistive layer having a desired shape may be obtained without adding a separate mask process.

Figure 10:
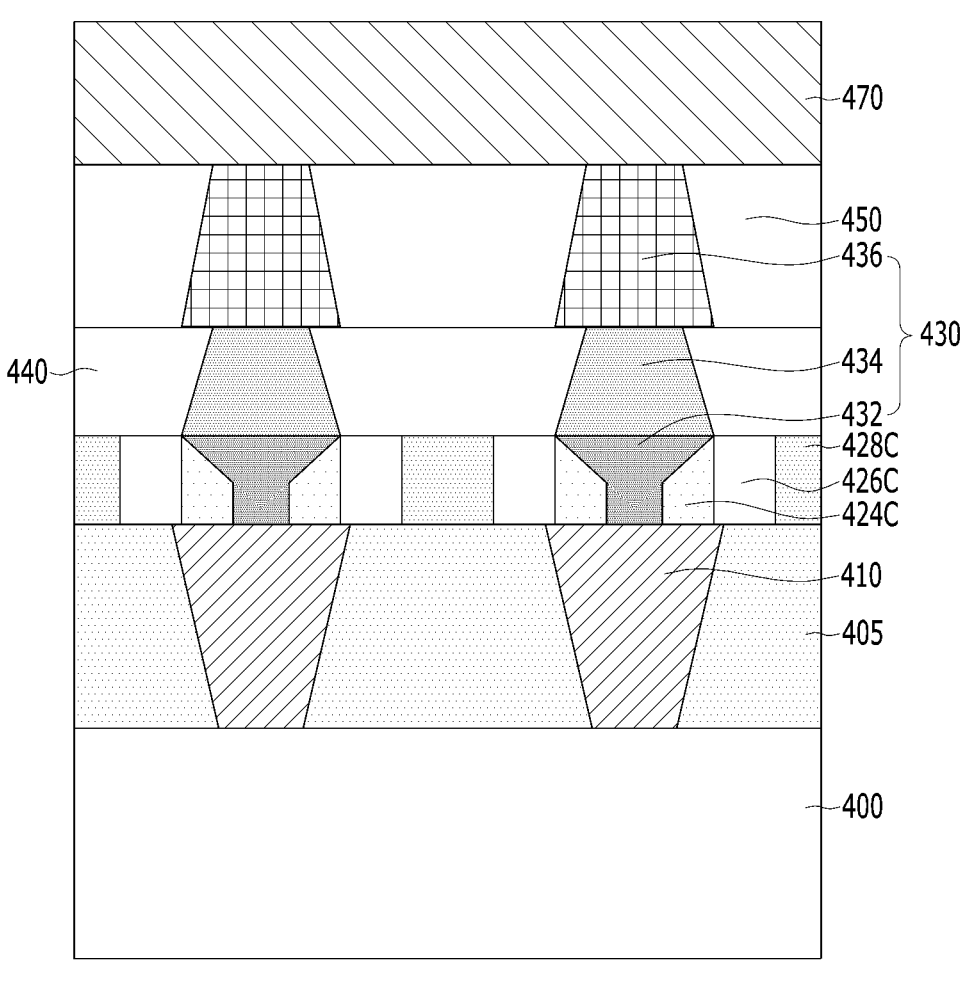
FIG. 10 is a cross-sectional view illustrating a semiconductor device based on some embodiments of the disclosed technology.

FIG. 10 is a cross-sectional view illustrating a semiconductor device and a method for fabricating the semiconductor device based on some embodiments of the disclosed technology.

Referring to FIG. 10, a first conductive line 410 and a first interlayer insulating layer 405 may be formed over a substrate 400, and a resistive layer 432, and first to third insulating patterns 424C, 426C, and 428C may be formed over the first conductive line 410 and the first interlayer insulating layer 405.

Subsequently, a selector layer 434 may be formed over the resistive layer 432. The selector layer 434 may be performed by depositing a selector material and selectively etching the selector material. A space between the selector layers 434 may be filled with a second interlayer insulating layer 440.

Subsequently, a memory layer 436 may be formed over the selector layer 434. The memory layer 436 may be performed by depositing a memory material and selectively etching the memory material. A space between the memory layers 436 may be filled with a third interlayer insulating layer 450. Thus, a memory cell 430 in which the resistive layer 432, the selector layer 434, and the memory layer 436 are stacked may be formed.

A second conductive line 470 may be formed over the memory layer 436 and the third interlayer insulating layer 450.

In some embodiments, the selector layer 434 and the memory layer 436 may be etched using different masks. As a result, sidewalls of the selector layer 434 and the memory layer 436 may not be aligned with each other.

When the aspect ratio of the stacked structure of the selector layer 434 and the memory layer 436 is large, the process may be simplified by separately patterning the selector layer 434 and the memory layer 436 as in some embodiments.

In some embodiments of the disclosed technology, an operation failure of a memory cell may be reduced and/or prevented, and a hold current of a selector of the memory cell may be easily controlled.

Although various embodiments have been described for illustrative purposes, it should be understood that modifications to the disclosed embodiments and other embodiments based on what is described and/or illustrated in this patent document.

What is claimed is:

1. A semiconductor device comprising a plurality of memory cells, each of the plurality of memory cells comprising:
   a resistive layer including a material having a specific resistance and including a lower portion and an upper portion disposed over the lower portion, wherein a width of the lower portion is smaller than a width of an uppermost surface of the upper portion;
   a selector layer disposed over the resistive layer and structured to perform a threshold switching by exhibiting different electrically conductive states in response to an applied voltage relative to a threshold voltage; and
   a memory layer disposed over the selector layer and structured to store data,
   wherein the selector layer maintains an on-state in response to maintaining a current flowing through the selector layer above a hold current, and wherein the presence of the resistive layer reduces the hold current of the selector layer, and
   wherein the hold current decreases in response to a decrease in the width of the lower portion of the resistive layer.

2. The semiconductor device according to claim 1, further comprising:
   a plurality of first conductive lines extending in a first direction; and
   a plurality of second conductive lines extending in a second direction crossing the first direction,
   wherein the plurality of memory cells is arranged at intersection regions where the plurality of first conductive lines vertically overlaps the plurality of second conductive lines, respectively, and the resistive layer has a resistance greater than a resistance of the first conductive line or the second conductive line.

3. The semiconductor device according to claim 1, wherein the upper portion of the resistive layer has a width that increases from bottom to top.

4. The semiconductor device according to claim 1, wherein the lower portion of the resistive layer has a constant width.

5. The semiconductor device according to claim 1, further comprising:

first to Nth insulating patterns sequentially disposed from a side surface of the resistive layer while surrounding the side surface of the resistive layer, wherein where N is a natural number equal to or greater than 2, wherein an etch rate of the $t_{th}$ insulating pattern among the first to Nth insulating patterns is less than an etch rate of the $t-1_{th}$ insulating pattern, wherein t is a natural number equal to or greater than 2 and equal to or smaller than N.

6. The semiconductor device according to claim 5, wherein the first to $N_{th}$ insulating patterns are formed of materials different from each other.

7. The semiconductor device according to claim 5, wherein at least two of the first to $N_{th}$ insulating patterns include a same element, and a composition ratio of elements of one of the at least two of the first to $N_{th}$ insulating patterns is different from a composition ratio of elements of another one of the at least two of the first to $N_{th}$ insulating patterns.

* * * * *